United States Patent [19]
Howard et al.

[11] Patent Number: 6,023,259
[45] Date of Patent: Feb. 8, 2000

[54] OLED ACTIVE MATRIX USING A SINGLE TRANSISTOR CURRENT MODE PIXEL DESIGN

[75] Inventors: Webster E. Howard, Lagrangeville; Olivier Prache, Pleastantville, both of N.Y.

[73] Assignee: Fed Corporation, Hopewell Junction, N.Y.

[21] Appl. No.: 09/041,637

[22] Filed: Mar. 13, 1998

Related U.S. Application Data

[60] Provisional application No. 60/052,343, Jul. 11, 1997.
[51] Int. Cl.[7] ................................. G09G 3/14; G09G 3/32
[52] U.S. Cl. ................................. 345/76; 345/46; 345/82; 345/205; 315/169.1; 315/169.3; 315/169.4
[58] Field of Search ................................. 345/76, 77, 78, 345/79, 80

[56] References Cited

U.S. PATENT DOCUMENTS

| | | |
|---|---|---|
| 5,247,190 | 9/1993 | Friend et al. . |
| 5,294,810 | 3/1994 | Egusa et al. . |
| 5,294,869 | 3/1994 | Tang et al. . |
| 5,294,870 | 3/1994 | Tang et al. . |
| 5,331,182 | 7/1994 | Takimoto et al. . |
| 5,349,209 | 9/1994 | Moyer et al. . |
| 5,352,906 | 10/1994 | Shinar et al. . |
| 5,408,109 | 4/1995 | Heeger et al. . |
| 5,424,560 | 6/1995 | Norman et al. . |
| 5,457,565 | 10/1995 | Namiki et al. . |
| 5,482,896 | 1/1996 | Tang . |
| 5,486,406 | 1/1996 | Shi . |
| 5,504,323 | 4/1996 | Heeger et al. . |
| 5,514,878 | 5/1996 | Holmes et al. . |
| 5,518,824 | 5/1996 | Funhoff et al. . |
| 5,530,269 | 6/1996 | Tang . |
| 5,532,550 | 7/1996 | Adler . |
| 5,546,413 | 8/1996 | Lebby et al. . |
| 5,552,547 | 9/1996 | Shi . |
| 5,552,678 | 9/1996 | Tang et al. . |
| 5,583,349 | 12/1996 | Norman et al. . |
| 5,583,350 | 12/1996 | Norman et al. . |
| 5,587,589 | 12/1996 | So et al. . |
| 5,714,968 | 2/1998 | Ikeda ........................................ 345/77 |
| 5,751,263 | 5/1998 | Huang et al. ............................. 345/82 |

*Primary Examiner*—Bipin Shalwala
*Assistant Examiner*—David L. Lewis
*Attorney, Agent, or Firm*—Collier, Shannon, Rill & Scott, PLLC

[57] ABSTRACT

The present invention is a current driver for an active matrix organic light emitting device display. As embodied herein, the driver relies upon a single transistor, driven in a saturation regime to provide a current source for an OLED. This results in a pulse drive. The driver of the present invention is compatible with high speed integrated drivers and can be fabricated on the same substrate as the OLED. A technique for driving an OLED is disclosed that will produce a good quality gray scale image.

10 Claims, 4 Drawing Sheets

OLED ACTIVE MATRIX USING A SINGLE TRANSISTOR CURRENT MODE PIXEL DESIGN

CROSS REFERENCE TO RELATED PATENT APPLICATION

This application relates to and claims priority on provisional application serial No. 60/052,343 filed Jul. 11, 1997.

FIELD OF THE INVENTION

Present invention relates to organic light emitting devices. More specifically, the present invention relates to an organic light emitting device ("OLED") that is driven in a pulsed or alternating manner to provide a current source for the OLED device. The present invention relates to a technique for driving on OLED that will produce a good quality gray scale image.

BACKGROUND OF THE INVENTION

Organic light emitting devices ("OLEDs") have been known for approximately two decades. All OLEDs work on the same general principles. One or more layers of semiconducting organic material is sandwiched between two electrodes. An electric current is applied to the device, causing negatively charged electrons to move into the organic material(s) from the cathode. Positive charges, typically referred to as holes, move in from the anode. The positive and negative charges meet in the center layers (i.e., the semiconducting organic material), combine, and produce photons. The wave-length—and consequently the color—of the photons depends on the electronic properties of the organic material in which the photons are generated.

The color of light emitted from the OLED device can be controlled by the selection of the organic material. White light is produced by generating blue, red and green lights simultaneously. Specifically, the precisely color of light emitted by a particular structure can be controlled both by selection of the organic material, as well as by selection of dopants.

In a typical OLED, one of the electrodes is transparent. The cathode is typically constructed of a low work function material. The holes are typically injected from a high work function anode material into the organic material. Typically the devices operate with a DC bias of from 2 to 30 volts. The films may be formed by evaporation, spin coating or other appropriate polymer film-forming techniques, or chemical self-assembly. Thicknesses typically range from a few mono layers to about 1 to 2,000 angstroms.

OLEDs typically work best when operated in a current mode. The light output is much more stable for constant current drive than for a constant voltage drive. This is in contrast to many other display technologies, which are typically operated in a voltage mode. An active matrix display using OLED technology, therefore, requires a specific pixel architecture to provide for a current mode of operation.

The traditional approach to this problem is to use a pair of transistors and a storage capacitor. This allows for a quasi-DC drive of the OLED. This mode of operation increases the luminous efficiency of the device, while lowering peak current operating requirements.

This approach, however, presents several potential problems. First, for see-through applications, the non-emissive components of the device reduce the effective light emitting area. Given the relatively high efficiency of the OLED material, a low transconductance is typically required from the drive transistor M2, as shown in FIG. 1. This allows the drive transistor to be controlled via its gate source voltage with a practical range of approximately one volt. In practice, however, this translates to reducing the typical transconductance value of the device by five orders of magnitude. A reduction of this magnitude, however, is not easily achievable.

Second, the alternative of lowering the transconductance to acceptable values presents other challenges. The active material could be changed, for example, by replacing crystal silicon with amorphous silicon. This, however, results in impractical transistor characteristics for integrated drivers that are deposited on the same substrate as the emissive array.

Third, the current source formed by transistor M2 is controlled by only the gate voltage. This voltage is maintained by the storage capacitor, depicted as C1 in FIG. 1. For fixed level operation $V_{DD}$, the only gray scale driving technique possible is current amplitude modulation. This presents unique challenges when operating the device in a gray scale mode with a large number of gray levels. The degree of modulation available becomes more tightly constrained, the larger the number of gray scale levels.

An alternative drive scheme is to pulse $V_{DD}$ once per frame. This allows the uniform scaling of the amplitude modulation according to the length of the $V_{DD}$ pulse.

Further, a reverse bias diode across transistor M2 may be required to refresh the OLED at the end of each frame. The conduction state of transistor M2 is data dependent and, therefore, unpredictable. Hence, the need for the reverse bias diode to reset the voltage prior to receipt of the next piece of data.

Although substantial progress has been made in the development of OLEDs to date, substantial additional challenges remain. For example, the whole class of organic devices continues to face a general series of problems associated with their long-term stability. In particular, the sublimed organic film may undergo recrystallization or other structural changes that adversely effect the emissive properties of the device.

Exposure to air and moisture presents unique problems with respect to OLEDs. Lifetimes of 5,000 to 35,000 hours have been obtained for evaporated films and greater than 5,000 hours for polymers. These values, however, are typically reported for room temperature operation in the absence of water and oxygen. Typically, the low work function cathode is susceptible to oxidation by either water or oxygen. Electroluminescence from these oxidized spots is typically darker than elsewhere. It is suspected that the oxidation induces delamination of the device.

Temperature stability poses additional constraints. Although the present inventors are aware of no published work at this time on the mechanisms for thermal degradation of these devices, the present inventors strongly suspect that thermal activation would effect the crystallization of the organic material as well as any reactions of the dopant and the organic materials making up the device.

Additional research has been done on understanding surface effects at the interface of the cathode with the OLED device. The present inventors also strongly suspect that the numerous reactions that can occur at the interface could strongly effect the lifetime of the device.

Prior inventors have attempted to solve the foregoing problems by using an alternating current drive scheme for the electroluminescent device. Tang, et al., U.S. Pat. No.

5,552,678 for AC Drive Scheme for Organic LED, discloses and claims applying an alternating voltage across the anode and cathode for driving an OLED. The use of alternating drive current improves the stability and operating performance of the OLED.

Most practical applications of OLEDs require limited voltage input, or light output, variance over an extended period of time. The limited stability of certain OLED devices has deterred, to some extent, their widespread use. When a constant voltage is applied, progressively lower current densities result. Lower current densities result in lower levels of light output with a constant applied voltage; eventually levels drop below acceptable levels.

If the applied voltage is progressively increased to compensate for this degradation and to hold light emission levels constant, the field across the OLED device increases. Furthermore, degradation may lead to a need for increased current to maintain constant light output. Eventually, a voltage level is required that cannot be supplied conveniently by the OLED device driver circuitry. Alternatively, the voltage level required produces a field exceeding the dielectric breakdown strength of the layers separating the electrodes. This results in catastrophic failure of the device.

Tang reports achieving stability and sustained operating performance of OLED by driving the device with an alternating voltage source. This alternating drive extends the useful life and reliability of the OLED, by eliminating catastrophic failure frequently encountered when the device is operated in a DC mode. With AC drive, the impedance of the EL device shows little variation with operation. Currents flowing through the OLED device with constantly alternating current do not significantly change with time. As a result, it is not necessary increase the voltage on the OLED to the same degree during operation. It is this increase that would eventually cause catastrophic failure due to dielectric breakdown of the organic film.

Tang also reports that the AC drive is crucial in eliminating shorting pathways due to located or point defects. These types of defects are often found in OLED and form semiconductive pathways between the anode and cathode. In operation these paths shunt current that would otherwise flow through the OLED film generating electroluminescence. This parasitic current loss is eliminated by the application of AC drive resulting in higher luminescence and operating stability.

Tang discloses that any AC drive scheme is better than a DC drive scheme in operating an OLED device. Tang asserts, however, that a certain form of asymmetric alternating current drive gives the best performance in sustaining the operational life of the device. Specifically, Tang discloses and claims an AC voltage cycle in which the reverse voltage of the AC cycle is less than the forward voltage. Specifically, in Tang, the voltage on the cathode is more positive than the voltage on the anode during the reverse portion of the cycle. During the forward portion of the cycle, the voltage on the anode is more positive than the voltage on the cathode. Tang also discloses that the time duration of the of the reverse portion can be significantly shorter than the time duration of the forward portion of the AC cycle. Tang claims that this asymmetry provides more time for the generation of electroluminescence, which is produced only in the forward portion of the AC cycle. Tang, however, does not disclose any particular structure for achieving AC drive.

FIG. 1 depicts a prior method of achieving AC drive. In particular, a pair of transistors and a storage capacitor may be used to achieve alternating current drive.

The present invention seeks to overcome certain of the problems that result from prior methods of obtaining AC drive and results in a design which is not only simpler in operation and easier to fabricate. The device of the present invention is also easier to drive than prior known approaches. The present inventors expect that it yield significant system cost reductions relative to prior driver methods.

First, the present invention is anticipated to reduce the size of the non-emissive driver devices, therefore, yielding more space on the emissive device, reducing the amount of light blocked by the driver circuitry and, effectively increasing the light emitting area of the device.

Second, the higher current requirement of the present invention reduces the need to lower the transconductance of the transistor.

Third, the present invention provides the ability to generate gray levels by pulse width modulation, in addition to amplitude modulation. This provides a more forgiving control mechanism and eliminates many of the challenges faced when operating on a gray scale mode width a large number of gray scale levels at low-end gray levels toward black. These levels typically require a very small difference between adjacent control levels. These levels can be generated using a pulse with modulation between two larger control levels. Further, the present invention eliminates the need for a reverse bias diode to refresh the OLED at the end of each frame period. The present invention forces all gates and all sources to ground, reversing the polarity of the other terminal of the OLED. This guarantees that all transistors are in conduction, allowing the use of a reverse bias cycle for the OLED. The conduction state is not data dependent and becomes more predictable.

The luminous efficiency of the OLED is reduced by operating at a pulse drive mode. Nonetheless, the advantages obtained by the present invention, in the present inventor's view, far outweigh this modest disadvantage.

OBJECTS OF THE INVENTION

It is therefore an object of the present invention to provide a pulsed drive current source for an OLED.

Another object of the present invention is to provide a driving technique for an active matrix OLED display that relies on a single transistor.

A further object of the present invention is to provide a driving technique for an active matrix OLED display that is driven in a saturation regime to provide a current source for the OLED.

Yet another object of the present invention is to provide a current source driver for an OLED that increases the effective light emitting area of the OLED.

Another object of the present invention is to provide a current mode driver for an OLED that avoids the necessity for lowering the transistor transconductance.

A further object of the present invention is to provide a current mode driver for an OLED device that allows driving techniques other than amplitude modulation.

Yet another object of the present invention is to provide a current driver for an OLED device that allows the OLED to be driven by pulse width modulation.

It is another object of the present invention to provide a technique for driving an active matrix for an OLED that is capable of both pulse width modulation and amplitude modulation.

An additional object of the present invention is to provide a current driver for an OLED that allows greater flexibility for generating various levels of intensity of the OLED display.

It is another object of the present invention to provide a technique for driving an OLED that will produce a good quality gray scale image.

Yet a further object of the present invention is to provide OLED architecture that facilitates reverse bias of the scanned OLED array.

An additional object of the present invention is to simplify the design of OLED drivers.

An additional object of the present invention is to provide an OLED current mode driver that is easier to fabricate than prior drivers.

An additional object of the present invention is to provide an OLED current mode driver that yields system cost reductions.

Another object of the present invention is to provide an OLED current mode driver that extends the lifetime of the OLED.

An additional objection of the present invention is to provide an OLED current mode driver that is compatible with low voltage and/or high speed integrated drivers.

Additional benefits and advantages of the present invention will be apparent to those of ordinary skill in the art.

BRIEF SUMMARY OF THE INVENTION

In response to this challenge, applicants have developed an innovative, economical current mode driver for an organic light emitting diode comprising control means for pulsing the current delivered to the OLED in current mode operation.

The present invention is directed to a method for driving an active matrix for an organic light emitting device. The method comprises the steps of providing a control circuit for the organic light emitting device. The control circuit includes a transistor. The method also includes the steps of supplying data information to the control circuit, and operating the control circuit in a current mode.

The step of supplying data information to the control circuit includes supplying the data information to the transistor. The transistor includes a gate terminal and a drain terminal. The data information may be supplied to the gate terminal of the transistor. A voltage source may be applied to the drain terminal of the transistor.

The step of operating the control circuit includes supplying current through the transistor. Furthermore, the supply of current through the transistor may be modulated. This produces gray scale levels.

The present invention is also directed to a method of driving an active matrix for an organic light emitting device that is capable of producing gray scale images. The method comprises the steps of providing a control circuit for the organic light emitting device. The control circuit includes a transistor. The method also includes the steps of supplying data information to the control circuit, and operating the control circuit in a current mode.

The present invention is also directed a method of generating gray levels for a display for an organic light emitting device. The method comprises the steps of performing pulse width modulation, and performing amplitude modulation.

The present invention is also directed to a current driven device. The prior art references disclose a voltage driven device. The current driven device of the present invention is superior in that the luminance is directly proportional to the current, and the light output is much more stable for constant current drive than for constant voltage. In addition, by using a current drive, it is easier to obtain a uniform response from all the cells or individual OLEDs in an array configuration. In contrast, a voltage drive encounters threshold variations of both the transistor and the OLED device. Additionally, the present invention allows for a reverse bias cycle (i.e., an AC cycle) without additional circuitry.

The current drive innovation of the present invention lies in the use of the gate of the transistor as the data terminal. By contrast, the drain (or source) of the transistor is the data terminal in the voltage driven device. Furthermore, the gate is only a switch actuator in the voltage driven device.

In an embodiment of the present invention, the current driver controls a display device having pixels with one or more organic light emitting devices (OLED) in response to data information. The OLED comprises an array of pixels disposed in rows and columns. The OLED further comprises transistor means having a gate terminal, source electrode and drain terminal for controlling the OLED device. The data information being applied to the gate terminal of the transistor, the pixels disposed in the same row of the array being connected to the same source electrode of the transistor. The first end of the OLED being connected to drain terminal of the transistor, and the second end of the OLED being biased at a voltage such that the transistor, when selected, is in saturation.

In a further embodiment of the present invention, the current driver controls an organic light emitting device comprising pixels in response to data information. The pixels are disposed in rows and columns. The OLED further has transistor means having a gate terminal, source electrode, and drain terminal, for controlling the OLED device. The data information being applied to the gate terminal of the transistor. The pixels disposed in the same row of the array being connected to the same source electrode of the transistor. The first end of the OLED being connected to the drain terminal. The second end of the OLED being biased at a voltage such that the transistor, when selected, is in saturation, wherein the OLEDs are driven in pulses of current, and wherein the width of the pulses are modulated to control the intensity of the pixel.

It is to be understood that both the foregoing general description and the following detailed description are exemplary and explanatory only. And are not restrictive of the invention as claimed. The accompanying drawings, which are incorporated herein by reference and which constitute a part of the specification, illustrate certain embodiments of the invention and, together with the detailed description, serve to explain the principles of the present invention.

BRIEF DESCRIPTION OF THE DRAWINGS

The present invention will now be described in connection with the following figures in which like reference numbers refer to like elements and wherein.

DETAILED DESCRIPTION OF THE INVENTION

Reference will now be made in detail to a preferred embodiment of the present invention, and an example of which is illustrated in the accompanying drawings.

Figure 2:
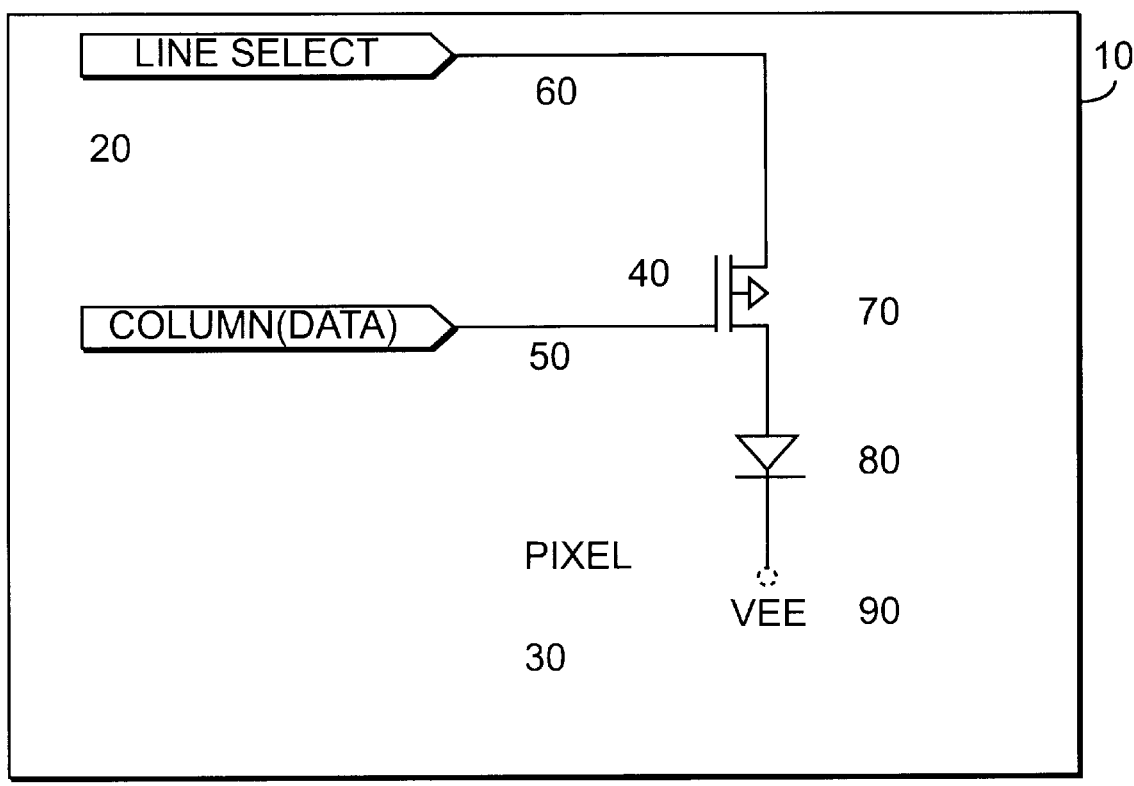
FIG. 2 is a schematic diagram of a control circuit of a preferred embodiment of the present invention.

A preferred embodiment of an OLED control circuit 10 of the present invention is shown in FIG. 2. An OLED driver 20 of the OLED control circuit 10 of the present invention is operated in a current mode. As embodied herein, OLED control circuit 10 comprises a driver 20 and OLED 80. OLED driver 20 further comprises a transistor 40 and a voltage source 90.

In a preferred embodiment of the present invention, data information is supplied to a gate terminal 50 of the transistor 40. This is in distinct contrast to other display technologies (e.g., AMLCD), in which data information is applied to the drain terminal of the transistor.

In a preferred embodiment of the present information, pixel selection is accomplished by controlling the source terminal. All pixels in a given row share the same source electrode control. As embodied herein, the OLED is connected to the drain terminal 70 of the transistor 40. The OLED 80 of the present invention has first and second ends. The first end of OLED 80 is connected to drain terminal 70 of the transistor 40. The second end of the OLED 80 is connected to the voltage source 90. The voltage source 90 is biased at a voltage such that transistor 40 when selected, is always in saturation.

As embodied herein, the rows of the pixels are controlled by selection of source electrode 60. The columns of the display are controlled by selection of gate electrode 50. The electrodes 50 and 60 control the delivery of current to OLED 80 through drain terminal 70.

The pixel 30 of the present invention is driven in a pulsed fashion. The pixel 30, therefore, is not illuminated at all times during its operation. It is desirable, therefore, to adapt the pixel 30 to be brighter than it would otherwise be in a mode of illumination in which the pixel is illuminated constantly, to make up for those periods of time during its operational cycle when the pixel is not illuminated. This increase in current is proportional to the number of rows in the array.

While this factor may be perceived, at first glance, as a drawback of the present invention, those persons skilled in the art will quickly appreciate that a higher current requirement removes the need to lower the transconductance of the transistor. As noted above, lowering transistor transconductance to acceptable levels can be accomplished by a variety of means, including changing the selection of active material. For example, crystalline silicon may be replaced with amorphous silicon. This often, however, produces impractical transistor characteristics for integrated drivers that are disposed on the same substrate as the emissive array. This feature of the present invention, therefore, permits the selection of high speed device drivers that are compatible with the substrate material on which the array is disposed. This feature allows for the use of conventional semiconductor processing techniques in fabricating the driver 20 of the present invention.

Additionally, the OLED 80 of the present invention will be compatible with high speed integrated drivers 20. Having only one transistor device per pixel reduces the amount of related control circuitry. This makes more space available on the substrate for emission of light. By reducing the amount of area occupied by the device driver, relative to prior techniques, the present invention enhances the use of OLEDs in see-through applications.

As noted above, prior techniques for operating in a gray scale mode were useable only through amplitude modulation. This presented a number of challenges, as noted above. In a preferred embodiment of the present invention, however, gray levels can be generated by either amplitude modulation and/or pulse width modulation. The present invention, therefore, provides greater flexibility in driving technique. That flexibility makes the present invention more forgiving of process variations.

For example, low-end gray levels, that is gray levels toward black, typically require very small differences between adjacent control levels. The present invention allows those small differences to be generated using pulse width modulation between two larger control levels. The pulse width is generated by a digital circuit and determines the amount of current flowing through the OLED device more accurately than is available with prior techniques. In addition, this provides greater control of current flow over the entire array.

At higher luminescence levels, amplitude modulation can be used to generate upper gray scale levels. The present inventors believe that this feature may have a significant impact on driver and system design.

Specifically, to display a good quality gray scale image requires a constant ratio (K) between adjacent gray levels. Given a contrast ratio (CR) of 100:1 and 256 gray levels, it can be seen that $K=CR^{1/256}=1.018$. If a pulse width modulation driver were to be used exclusively, the separation between the pulses for low grade levels would have to follow the same ratio within a line period. For a VGA display having 480 rows of roughly 30 micro seconds duration, this leads to the smallest pulse width being 300 ns. The incremental pulse width dictated by this timing is $(K-1)\times300=5.4$ ns. To generate a pulse of this duration, the system would need a 189 Mhz clock frequency to generate the required timing. For reference, the pixel rate of a VGA display is typically 25 Mhz. On the basis of the above calculation, persons of ordinary skill in the art would apprehend the benefit of combining pulse width modulation with amplitude modulation to reduce clock rates, while deriving the other benefits of the present invention.

Figure 1:
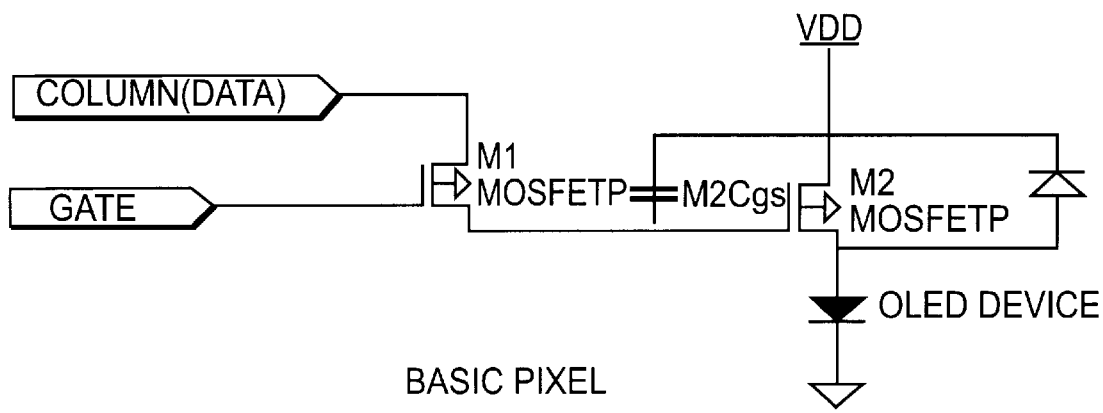
FIG. 1 is a circuit diagram of a control circuit of a type known prior to the present invention.

The present invention facilitates, through a reversed bias of the scanned OLED array the refreshing of OLED. In prior approaches, an additional diode was required to refresh the OLED at the end of each frame period. Typically, a reverse bias diode was applied across transistor M2, as shown in FIG. 1, to refresh the OLED because the conduction state of transistor M2 is data dependent, and therefore unpredictable.

No such additional diode is required in a preferred embodiment of the present invention to refresh the OLED. As embodied herein, all gates and sources are forced to ground, reversing the polarity of the OLED's second terminal relative to its first end. This ensures that all transistors 40 are in conduction and, therefore, an appropriate reverse by a cycle for the OLED is possible. This factor maximizes the lifetime of the OLED. It will be apparent to those skilled in the art that various modifications and variations can be made in the construction and configuration of the present invention, without departing from the scope or spirit of the invention. For example, the concept of the present invention, as embodied herein, can easily be extended to polycrystalline and amorphous silicon technologies. It can be designed for N and P channel processes depending on the polarity of the OLED. The driver technology of the present invention is extremely broad and can be applied to any OLED device. Thus, it is intended that the present invention cover the modifications and variations of the invention, provided they come within the scope of the appended claims and their equivalents. Although the present invention requires higher peak currents than previous devices, the magnitude of this increase is only on the order of a few microamperes for a small high resolution display. This increase is well within the range that would be considered acceptable by persons of ordinary skill in the art of very large scale integration complementary metal oxide semiconductor (i.e., VLSI CMOS) processes.

Figure 3:
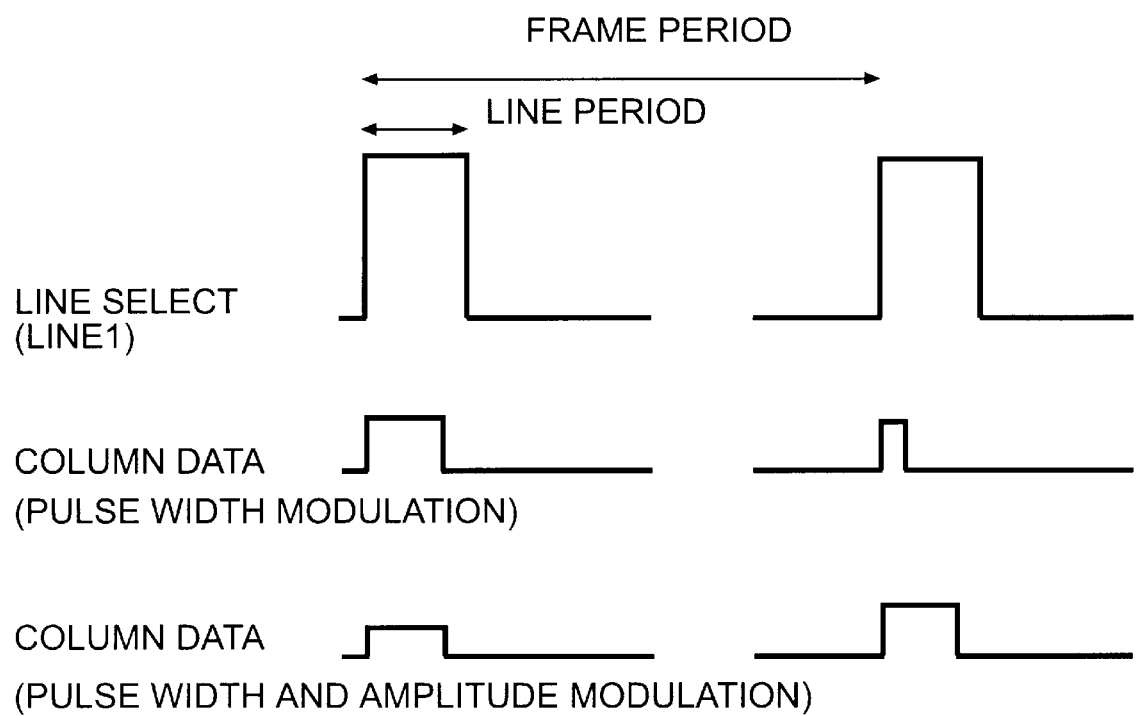
FIG. 3 is a graph depicting amplitude modulation according to the present invention.
Figure 4:
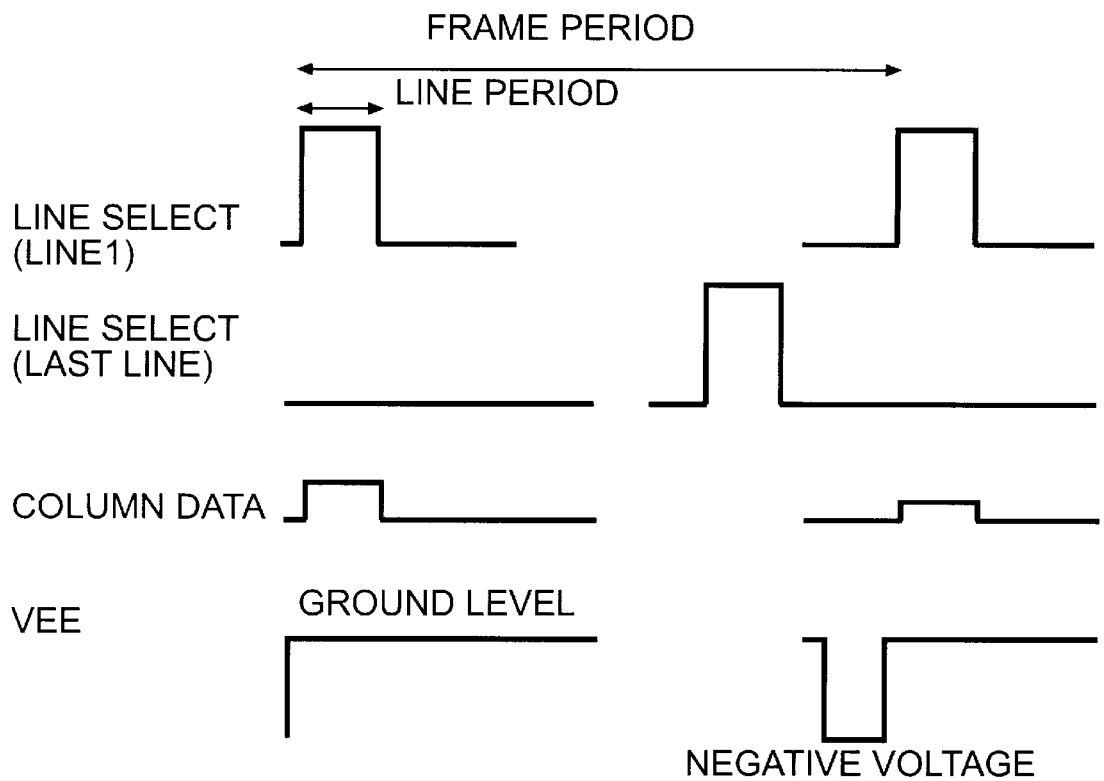
FIG. 4 is a graph depicting pulse width modulation and amplitude modulation according to the present invention.

FIGS. 3 and 4 represent the drive waveforms applied to the array terminal according to the present invention. The column data signal is a voltage level. The line select signal is a voltage sufficiently large to cover: the voltage required to drive the transistor 40 into saturation; and the maximum voltage required to reach the maximum brightness. The column data signal level will set the current flowing through the transistor 40 and thus through the OLED device 80. A modulation of this level results in a modulation of the current. The relation is that tying the drain-source current of the transistor to the gate level in the saturation mode $Ids=(\mu CW/2L)(Vgs-Vt)^2$. The current modulation results in a luminance modulation and thus in the realization of gray levels.

Amplitude modulation relies on the ability to generate controlled analog levels on the column data terminal 50. Even though the present innovation allows for a larger usable range of voltage levels on this terminal, there is a practical limit to the partitioning of this level into individual gray levels. This results from the low amount of current required to emit light.

The pulse width modulation drive also has limitations, as explained previously. By combining these two techniques, it is possible to extend the number of achievable gray levels, and thus the performance of the display. One benefit of the present invention is that it allows for the combination to be realized while maintaining a current drive, and therefore a uniform display.

A pulse width modulation drive is not practical with the cell arrangement described in FIG. 1 because of the reliance on a capacitor to hold the data. While in theory it may be possible to achieve a pulse width modulation drive with a capacitor, it will be apparent to those skilled in the art that this is not a very practical idea (if only because it relies on perfectly matched capacitors across the whole array).

It will be apparent to those skilled in the art that various modifications and variations can be made in the construction and configuration of the present invention without departing from the scope or spirit of the invention. For example, in the embodiment mentioned above, various changes may be made in the connectivity of the gate, source, and drain terminals of the transistor, all while preserving the function of the present invention as described herein. Further, it may be appropriate to make various modifications in materials of the present invention, or in the mode of operation as depicted in the enclosed graphs of voltage versus time for operation of a preferred embodiment of the present invention. Thus, it is intended that the present invention cover the modifications and variations of the invention, provided they within the scope of the appended claims and their equivalents.

While this invention has been described in conjunction with specific embodiments thereof, it is evident that many alternatives, modifications and variations will be apparent to those skilled in the art. Accordingly, the preferred embodiments of the invention as set forth herein we intended to be illustrative, not limiting. Various changes may be made without departing from the spirit and scope of the invention as defined in the following claims.

What is claimed is:

1. A organic light emitting device control circuit comprising:

an organic light emitting device having a first end and a second end; and a driver connected to said organic light emitting device, said driver being operated in a current mode, wherein said driver comprises a voltage source connected to said first end of said organic light emitting device, wherein said voltage source supplies voltage to said organic light emitting device, and a transistor having a drain terminal, a source electrode, and a gate terminal, wherein said drain terminal of said transistor is connected to said second end of said organic light emitting device, wherein said gate terminal and said source electrode control the delivery of current to said organic light emitting device through said drain terminal.

2. The control circuit according to claim 1, wherein control data information for operating said control circuit is supplied to said control circuit through said at least one electrode.

3. The control circuit according to claim 1, wherein said voltage source supplies a sufficient voltage such that said transistor, when selected, is in saturation.

4. The control circuit according to claim 1, wherein said organic light emitting device is driven in pulses of current.

5. The control circuit according to claim 4, wherein the pulses are modulated by said driver to control the intensity of the at least one organic light emitting device.

6. The current driver according to 1, wherein the delivery of current is modulated to produce gray scale levels.

7. A current driver for controlling a display device in a current mode in response to data information, wherein the display device comprising at least one pixel having at least one organic light emitting device having a first end and a second end, said current driver comprising:

a voltage source connected to the first end of the at least one organic light emitting device, wherein said voltage source supplies voltage to the at least one organic light emitting device; and a transistor having a drain terminal, a source electrode and a gate terminal, wherein said drain terminal of said transistor is connected to the second end of the at least one organic light emitting device, wherein said gate terminal, and said source electrode receive the data information and control the delivery of current to the at least one organic light emitting device through said drain terminal.

8. The current driver according to claim 7, wherein the at least one pixel comprises a plurality of pixels arranged in an array.

9. The current driver according to claim 8, wherein the plurality of pixels are arranged in at least one row and at least one column, wherein the pixels disposed in the same row are connected to the same source electrode, and the pixels disposed in the same column are connected to the same gate terminal.

10. The current driver according to 7, wherein the delivery of current is modulated to produce gray scale levels.

* * * * *